United States Patent
Kickhefel et al.

(10) Patent No.: US 9,000,765 B2
(45) Date of Patent: Apr. 7, 2015

(54) MAGNETIC RESONANCE METHOD AND SYSTEM TO DETERMINE THE POSITION OF A SLICE RELATIVE TO A REGION MOVING RELATIVE TO THE SLICE

(75) Inventors: Antje Kickhefel, Erlangen (DE); Joerg Roland, Hemhofen (DE); Eva Rothgang, Nuremberg (DE)

(73) Assignee: Siemens Aktiengesellschaft, Munich (DE)

(*) Notice: Subject to any disclaimer, the term of this patent is extended or adjusted under 35 U.S.C. 154(b) by 730 days.

(21) Appl. No.: 13/273,450

(22) Filed: Oct. 14, 2011

(65) Prior Publication Data

US 2012/0092011 A1 Apr. 19, 2012

(30) Foreign Application Priority Data

Oct. 15, 2010 (DE) .......................... 10 2010 042 518

(51) Int. Cl.
*G01R 33/48* (2006.01)
*G01R 33/34* (2006.01)
*G01R 33/565* (2006.01)
*G01R 33/563* (2006.01)

(52) U.S. Cl.
CPC ...... *G01R 33/4804* (2013.01); *G01R 33/56308* (2013.01); *G01R 33/56341* (2013.01); *G01R 33/56509* (2013.01)

(58) Field of Classification Search
CPC .................. G01R 33/4804; G01R 33/56308; G01R 33/56341; G01R 33/56509
USPC .......................... 324/300–322; 600/407–422
See application file for complete search history.

(56) References Cited

U.S. PATENT DOCUMENTS

| | | | |
|---|---|---|---|
| 2005/0070784 A1* | 3/2005 | Komura et al. ................ | 600/410 |
| 2007/0073141 A1 | 3/2007 | Iwadate et al. | |
| 2007/0167734 A1* | 7/2007 | Saranathan et al. .......... | 600/410 |
| 2009/0018432 A1 | 1/2009 | He et al. | |
| 2009/0112083 A1 | 4/2009 | Aulbach et al. | |
| 2010/0219828 A1 | 9/2010 | Takahashi et al. | |
| 2011/0178392 A1* | 7/2011 | Kuhara et al. ................. | 600/413 |

OTHER PUBLICATIONS

Rempp, Hansjörg, et al. "MR temperature monitoring applying the proton resonance frequency method in liver and kidney at 0.2 and 1.5 T: segment-specific attainable precision and breathing influence." Magnetic Resonance Materials in Physics, Biology and Medicine 21.5 (2008): 333-343.*

(Continued)

*Primary Examiner* — Melissa Koval
*Assistant Examiner* — Rishi Patel
(74) *Attorney, Agent, or Firm* — Schiff Hardin LLP

(57) ABSTRACT

In a magnetic resonance method and system to determine a position of a slice relative to a region moving relative to the slice within a predetermined volume segment of an examination subject located in the magnetic resonance system, a physical property within the slice is detected with spatial resolution at multiple points in time, such that a time curve of the physical property is detected for at least one voxel of the slice. The position of the slice relative to the region is determined with respect to defined points in time, depending on the time curve.

10 Claims, 3 Drawing Sheets

(56) References Cited

OTHER PUBLICATIONS

"Magnetic Resonance Imaging of the Upper Abdomen Using a Free-Breathing T2-Weighted Turbo Spin Echo Sequence with Navigator Triggered Prospective Acquisition Correction," Klessen et al., Journal of Magnetic Resonance Imaging, vol. 21 (2005) pp. 576-582.

"Regularized Multicoil MR Thermometry," Grissom et al., Proc. Intl. Soc. Mag. Reson. Med., vol. 17 (2009) p. 2516.

"Improved Calibration Technique for In Vivo Proton MRS Thermometry for Brain Temperature Measurement," Zhu et al., Magnetic Resonance in Medicine, vol. 60 (2008) pp. 536-541.

"Comparison of Four Magnetic Resonance Methods for Mapping Small Temperature Changes," Wlodarczyk et al., Phys. Med. Biol. vol. 44 (1999) pp. 607-624.

"Automatic Repositioning of Single Voxels in Longitudinal $^1$H MRS Studies," Hancu et al., NMR in Biomedicine (2005).

\* cited by examiner a)

b)

c)

MAGNETIC RESONANCE METHOD AND SYSTEM TO DETERMINE THE POSITION OF A SLICE RELATIVE TO A REGION MOVING RELATIVE TO THE SLICE

BACKGROUND OF THE INVENTION

1. Field of the Invention

The present invention concerns a method in order, given a detection of a physical property within a slice of a subject in a magnetic resonance system, to determine the position of this slice relative to a region moving relative to the slice, as well as a correspondingly designed magnetic resonance system.

2. Description of the Prior Art

Three-dimensional, high resolution real time temperature imaging by means of magnetic resonance tomography (also called MR temperature imaging) has in recent years developed into an essential aid for the monitoring and control of non-invasive or minimally invasive tumor therapy methods. The determination of the proton resonance frequency shift (PRF) of water protons given a temperature change is used as a standard method for the temperature determination from MR images; see for example W. Wlodarzcyk et al.; Phys. Med. Bio., 44, Pages 607-626, 1999.

Fast imaging methods (for example EPI, "echoplanar imaging") with measurement times shorter than 200 ms per slice in connection with reference-free methods allow the temperature determination of even moving organs given a continuous measurement; see for example M. Zhu et al.; MRM, 60 (3); Pages 536-541, 2008 or W. A. Grissom et al.; 17th International Meeting of International Society for Magn. Resonance in Medicine (ISMRM), Abstract #2516.

Problems result given real time temperature imaging due to the movement of a region or an organ between two acquisitions. This movement leads to false temperature values in the PRF method for temperature presentation, and a reference-free method for temperature measurement does not enable a dose calculation (i.e. a calculation of with what amount of heat a tumor is to be treated). A simulation of the slices acquired with a magnetic resonance system with regard to the moving region or organ is frequently insufficient, requires knowledge of breathing/cardiac cycles and is complicated in its practical realization.

In order to be able to determine the temperature curve at a defined point in a moving region or organ, for example, a segmentation and/or a non-rigid registration can be conducted. Such methods are still in development, however, and for MR data with a low signal-to-noise ratio (as occur in MR real time temperature imaging) results cannot be generated with sufficient speed and with sufficient quality for a quantification of the temperature. Moreover, parameters of these methods that are to be set are typically organ-specific, which additionally hinders the application of this method.

SUMMARY OF THE INVENTION

An object of the present invention is to detect the physical property within a slice at multiple points in time and to determine the position of the slice relative to a region moving relative to said slice at each of these points in time in an optimally simple manner.

This object is achieved in accordance with the present invention by a method to determine a position of a slice relative to a region moving relative to the slice within a predetermined volume segment of an examination subject, the determination being done by means of a magnetic resonance system, as follows:

A physical property within the slice is detected with spatial resolution at multiple points in time, such that a time curve of the physical property is detected for at least one voxel, or for at least one point of the slice. While the region or the organ thus moves periodically relative to the slice, in particular due to breathing or cardiac cycles, measurement values of the physical property for the image point(s) or voxel(s) of the slice are detected at multiple points in time. When these measurement values for a defined voxel of the slice are applied over time (i.e. for the multiple points in time), a time curve results. This time curve can be determined for the voxel (if there is only one voxel) or for each of these multiple voxels (if there are multiple voxels) of the slice. Depending on this time curve (or depending on these time curves, if there are multiple voxels), the position of the slice relative to the region is respectively determined at arbitrary points in time.

The slice is thus established within the predetermined volume segment such that the slice intersects the region (for example an organ to be examined) as often as possible, even when the region moves relative to the slice. Given knowledge of the dimensions of the relative movement of the region, or of the organ relative to the (immobile) slice, the slice is optimally established such that—in spite of the movement of the region (caused by breathing/cardiac cycles, for example) relative to the slice—the slice never lies outside of the region. However, according to the invention it is naturally also possible for the slice to intersect this region only in certain phases of the movement of the region relative to the slice. According to the invention, the position of the slice relative to the region can then be determined only at these points in time when an intersection between region and slice exists at this point in time.

The method according to the invention assumes that the detected physical property in the portion of the region that is spanned by the slice due to the relative motion of the region changes in a known manner, for example it rises or falls monotonically. If the slice now moves relative to the region, the position of a specific voxel of the slice within this region changes, and therefore the physical property that is detected for this voxel also changes. Since the direction of the change of the physical property (i.e. of the gradient) is known, the current position of the slice can be concluded from the change (or, more precisely, from the time curve) of the physical property.

As noted, the region moves periodically (for example due to breathing/cardiac cycles) relative to the slice, so the time curve of the physical property is likewise periodic. Therefore, the position of the slice relative to the region can be determined depending on an position of the detected physical property within a period of the time curve.

Due to the periodic movement of the region relative to the slice, a specific voxel of the slice that exists within the region with regard to the physical property moves along the known gradient. When the measurement values of the physical property for the specific voxel that are determined for each point in time are applied over the time period, a periodic curve or periodic fluctuation results, so each period of this curve exhibits a maximum and a minimum of the physical property. If the measurement value of the physical property at a defined point or position of a period (for example at the maximum or at 10% of the amplitude below the maximum value) is located at a specific point in time, at this point in time the slice is then located at the same position at which the slice was located at a previous point in time when a measurement value was detected at the same point or position of the preceding period.

In other words, the position of the slice at that point in time at which the measurement value was detected can be determined by the determination of the position of the measurement value within the respective period of the time curve. Expressed in another way, the slice is respectively located at the same position relative to the region when the measurement value detected for a specific voxel of the slice has the same position within the respective period. The method according to the invention thus enables a form of self-registration, by the point in time at which the slice again assumes the same position within the region being determined using the time curve of the physical property.

Although it is possible to create the time curve for each voxel of the slice, it is sufficient to evaluate only the time curve of one or a few voxels in order to determine the position of the slice at a specific point in time. Since the measurement values of the physical property are determined simultaneously for the slice, the position determination of one or a few voxels is sufficient in order to determine the position of the slice, and therefore the position of the other voxels.

The physical property can be a temperature, a flow speed, a diffusion coefficient, or results of a spectral analysis.

Functional maps, as is known, show spatially resolved physical properties of the tissue such as temperature, diffusion coefficients, flow speed, spectral information etc., and in particular the time curve of these physical properties to be used for the determination of the current position of the region (for example of an organ), i.e. as a criterion for registration of the measured position. The present invention enables functional maps instead of the anatomical images (magnitude images). Functional maps that have sharp gradients (gradients with a large spatial variation) are particularly suitable. For example, temperature maps are suitable for this given tumor ablations or results of flow measurements with sharp gradients in the region of blood-carrying veins, or results given diffusion coefficient/fiber tracking, or results given perfusion measurements.

According to an embodiment of the invention, for the detection of the physical property, an absolute value of the physical property is detected or measured for each voxel of the slice at the points in time. In that the position of the slice is determined for specific points in time relative to the region using the time curve, the absolute value of the physical property is also periodically determined with the relative movement of the region for the same respective voxel of the region, such that the curve of the absolute value can be tracked for the same voxel.

By the determination of the absolute value of the physical properties (for example the temperature) for each voxel of the slice for specific points in time, and the determination of the position of the slice for these points in time, the absolute value for this same voxel of the region accordingly also is determined periodically. For example, the curve of the temperature for the same voxel of the region (for example an organ) can be tracked.

Due to the relative movement, during a breathing/cardiac cycle the slice sweeps across multiple slices of the region (called region slices in the following), for example. If absolute values of the physical property are accordingly determined for voxels of the slice, absolute values of the physical property are therefore virtually determined for voxels of that region slice which corresponds to this point in time of the slice. Since there are multiple region slices which are swept by the slice, and since these region slices repeatedly correspond to the slice due to the periodic relative motion, the absolute values for the voxels of these region slices can be determined or reconstructed repeatedly.

Although only physical properties for the voxels of a slice are thus measured at multiple points in time, the physical properties can also be determined repeatedly for the voxels of each of these region slices due to the periodic relative motion of the region slices relative to the slice. Therefore a curve of the physical property can also be determined for each voxel of each region slice.

Naturally, according to the invention only one region slice can also be tracked. Whenever it is detected, using the time curve of the physical property, that the slice overlaps this region slice (corresponds to this region slice), the physical property can be determined for voxels of this region slice.

According to the invention, it is likewise possible to measure magnitudes of the MR signals also for the voxels of the slice at the multiple points in time given the detection of the physical property. While the physical property is derived from the phase values of the MR signals, an anatomical MR image can be reconstructed from the magnitude values of the MR signals. Since, as stated above, the slice moves relative to the region slices due to the periodic relative motion, multiple anatomical MR images can thus be created for each region slice (or for one or more defined region slices). Expressed differently, for each of the points in time it is not only the phase values but also the amplitude values of the MR signals that are detected, such that both the functional map (which comprises spatially resolved measurement values of the physical property for the slice at the respective point in time) and an anatomical MR image of the slice for the respective point in time are created. Since the slice moves periodically relative to the region slices due to the relative motion, such that at each point in time a different region slice (but the same region slice, with periodic repetition) corresponds to the slice, multiple anatomical MR images can thus be respectively created for multiple region slices (or also for only one region slice).

The detected magnitude values from which the anatomical MR images are reconstructed can also be used to exactly determine the position of the respective slice (i.e. for registration of the slice) within the region.

According to a preferred embodiment of the invention, the methods or embodiments according to the invention that are described in the preceding can also be implemented for multiple slices (and not only for one slice). With these multiple parallel slices it is possible to detect measurement values for the physical property in the entire volume of the region. Moreover, anatomical MR images can also be created for all region slices situated parallel to these slices. For this purpose, the extent of the relative motion is determined or predetermined, and the spacing of the slices is set such that it corresponds to this extent or is smaller than this extent. If the uppermost slice is arranged at the lower end of the region, it is thus ensured that each region slice comes into congruence with one of these slices at least once within a period due to the relative motion of the region relative to these slices.

Although the spacing of the slices (which is set depending on the extent of the relative motion) is thus normally markedly larger than the spacing of the region slices, due to the periodic relative motion all region slices are measured repeatedly, and thus the physical property within all region slices is determined repeatedly. In the same manner the anatomical MR images for all region slices can also be reconstructed repeatedly via the detection of the magnitude values.

For example, the method according to the invention can be used for real time temperature imaging within the scope of a monitoring and/or control of a tumor therapy method. A tumor therapy method means a method in which a specific region (for example an organ afflicted with a tumor) is specifically heated in order to combat the tumor. With the present invention the temperature in this region can be measured and therefore the tumor therapy method can be monitored and/or controlled.

The present invention offers the advantage that no triggering of the detection of the measurement values of the physical property is necessary, for example depending on specific positions of the region/organ to be monitored. An adaptation of the respective point in time of the detection of the measurement values of the physical property to a breathing cycle or cardiac cycle is also unnecessary.

The present invention also encompasses a magnetic resonance system to determine a position of a slice relative to a region moving relative to the slice within a predetermined volume segment of an examination subject. The magnetic resonance system has a basic field magnet, a gradient field system, multiple RF antennas and a control device with which the gradient field system and the RF antennas are activated. Measurement signals acquired by the RF antennas are received and evaluated; and MR image data are generated therefrom. The magnetic resonance system detects a physical property within the slice with temporal resolution at multiple points in time, wherein then a time curve of this physical property is reconstructed per voxel of the slice. The magnetic resonance system subsequently determines the position of the slice—which always has an intersection with the region during a relative motion of said region relative to said slice—relative to this region depending on the time curve that has been reconstructed beforehand.

The advantages of the magnetic resonance system according to the invention essentially correspond to the advantages of the method according to the invention as described above.

Furthermore, the present invention encompasses a non-transitory, computer-readable storage medium encoded with computer commands (in particular a computer program or software) that can be loaded into a memory of a programmable controller or computer of a magnetic resonance system. All or various embodiments of the method according to the invention that are described above can be executed when the computer commands are executed by the controller or control device of the magnetic resonance system. The commands may possibly require program means (libraries and auxiliary functions, for example) in order to realize the corresponding embodiment of the method. The software can be source code (C++, for example) that must still be compiled (translated) and linked or that only must be interpreted, or can be executable software code that has only to be loaded into the corresponding computer for execution.

The data storage medium can be, for example, a DVD, a magnetic tape or a USB stick, on which is stored electronically readable control information, in particular software.

The present invention is suitable for generating temperature maps given tumor ablations. Naturally, the present invention is not limited to this preferred field of application since the present invention is suitable to create arbitrary functional maps which, for example, comprise diffusion coefficients, flow speeds (flow maps), perfusion maps or results of spectral analyses.

BRIEF DESCRIPTION OF THE DRAWINGS

A magnetic resonance system according to the invention is schematically shown in FIG. 1.

The relative motion of an organ to be examined relative to the stationary slice is shown in FIGS. 2a through 2c.

Figure 3:
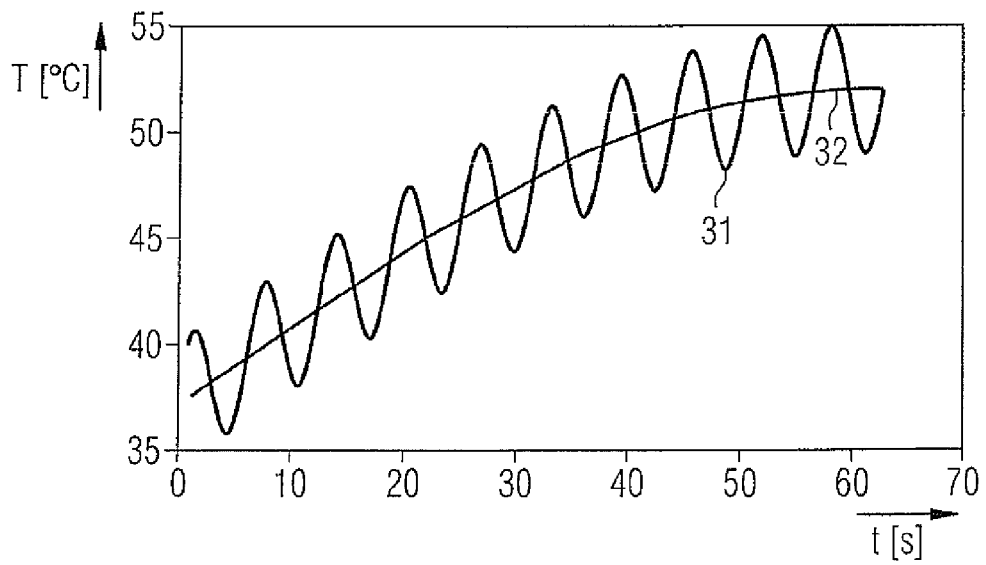

How measurement results for a specific region slice are extrapolated from periodic measurement results is shown in FIG. 3.

Figure 4:
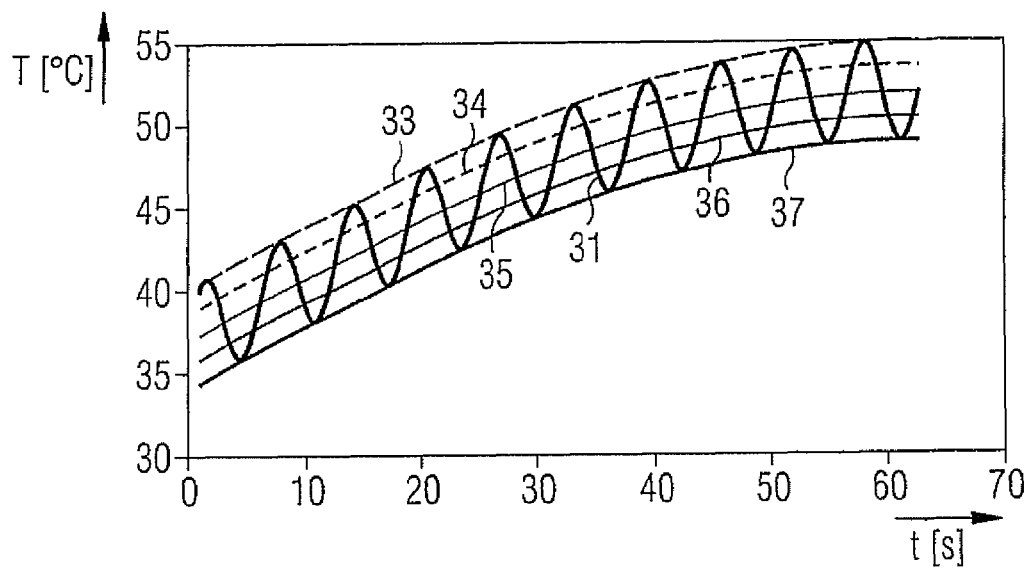

How measurement results for multiple specific region slices are extrapolated from periodic measurement results is shown in FIG. 4.

Figure 5:
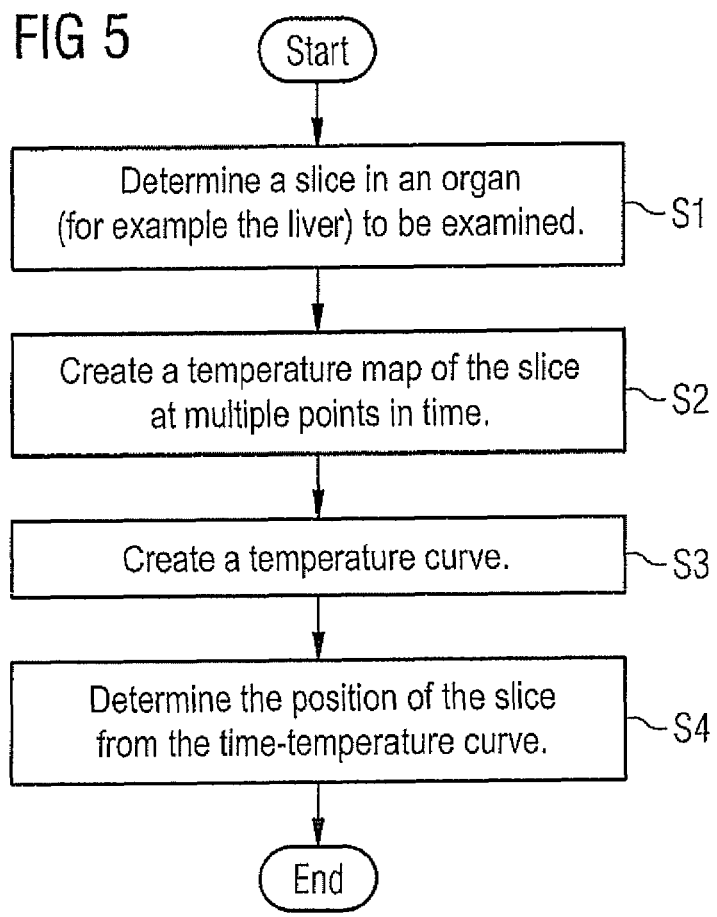

A program workflow diagram of an embodiment according to the invention is shown in FIG. 5.

DESCRIPTION OF THE PREFERRED EMBODIMENTS

Figure 1:
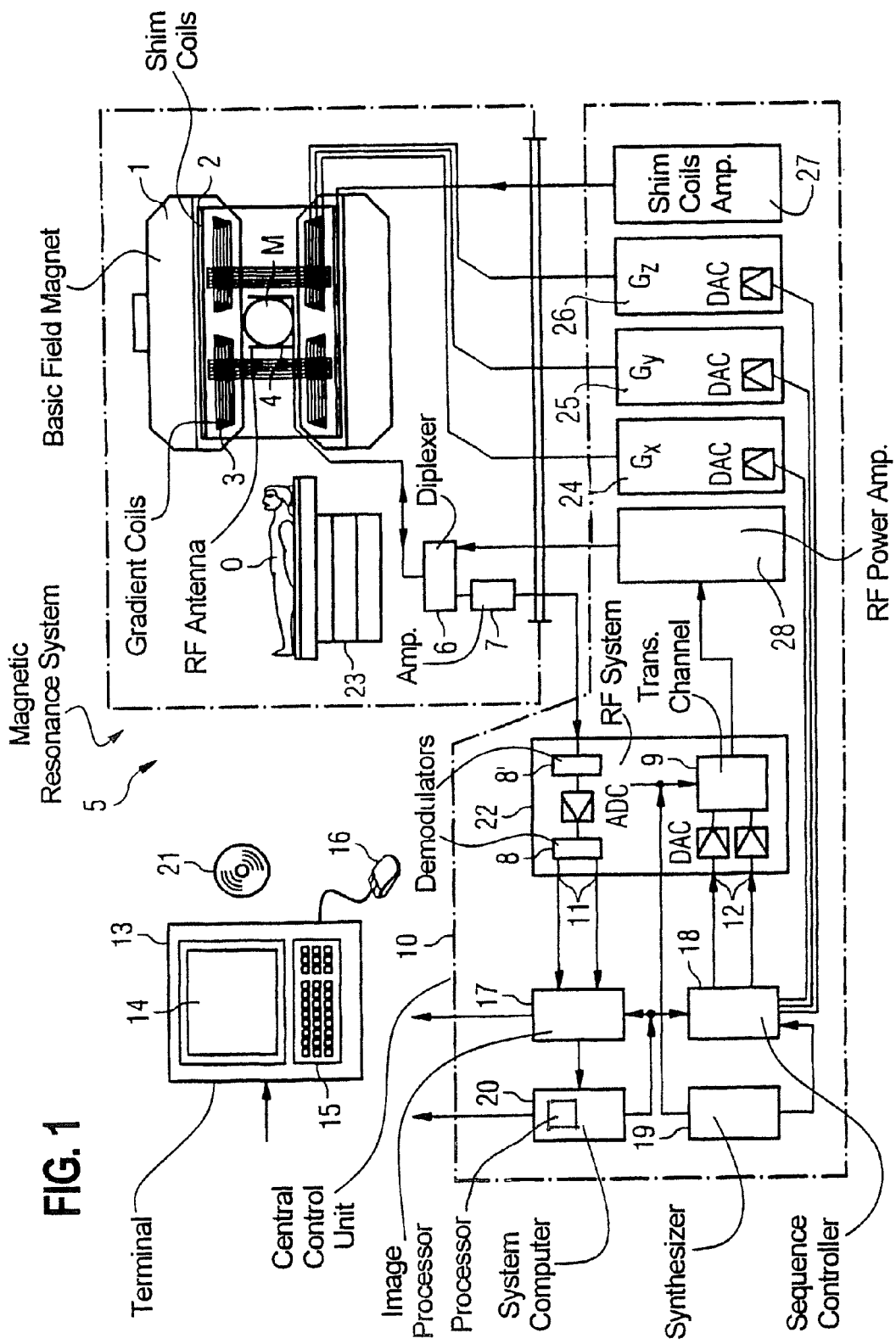

FIG. 1 schematically illustrates a magnetic resonance system 5. A basic field magnet 1 generates a temporally constant, strong magnetic field for polarization or alignment of the nuclear spins in an examination region of a subject O, for example of a region (organ) of a human body that is to be examined, the body lying on a table 23 within the magnetic resonance system 5. The high homogeneity of the basic magnetic field that is required for the magnetic resonance measurement (data acquisition) is defined in a typically spherical measurement volume M into which the region of the human body that is to be examined is moved. Shim plates made of ferromagnetic material are attached at suitable points to assist the homogeneity requirements, and in particular to eliminate temporally invariable influences. Temporally variable influences are eliminated by shim coils 2, operated by s shim coils amplifier 27.

A cylindrical gradient coil system 3 with three sub-windings is located in the basic field magnet 1. Each sub-winding is supplied with current by an amplifier to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. The amplifier has a digital/analog converter that is activated by a sequence controller 18 for time-accurate generation of gradient pulses.

One (or more) radio-frequency antennas 4 that convert the radio-frequency pulses emitted by a radio-frequency power amplifier into an alternating magnetic field for excitation of the nuclei and alignment of the nuclear spins of the subject to be examined or of the region of the subject O that is to be examined are located within the gradient field system 3. Each radio-frequency antenna 4 has one or more RF transmission coils and one or more RF reception coils in the form of an annular—advantageously linear or matrix-like—arrangement of component coils. The alternating field emanating from the precessing nuclear spins—i.e. normally the nuclear spin echo signals caused by a pulse sequence composed of one or more radio-frequency pulses and one or more gradient pulses—is also converted by the RF reception coils of the respective radio-frequency antenna into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from the digital/analog converter to the transmission channel 9. In the transmission channel 9 the pulse sequences are modulated on a radio-frequency carrier signal whose base frequency corresponds to the resonance frequency of the nuclear spins in the measurement volume. The output of the transmission channel 9 is supplied to an RF power amplifier 28, for supply to the RF antenna 4.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coil(s). The correspondingly acquired nuclear magnetic resonance signals are phase-sensitively demodulated on an intermediate frequency in a reception channel 8' (first demodulator) of the radio-frequency system 22 and digitized in an analog/digital converter (ADC). This signal is further demodulated on a frequency of 0. The demodulation on a frequency of zero and the separation into real part and imaginary part (or into phase value and magnitude value) occurs in a second demodulator 8 after the digitization in the digital domain. A functional map (for example a temperature map) and/or an MR image are reconstructed by an image computer 17 from the measurement data acquired in such a manner. The administration of the measurement data, the image data, the functional maps and the control programs takes place via the system computer 20. Based on a specification with control programs, the sequence controller 18 monitors the generation of the respective desired pulse sequences and the corresponding scanning of k-space. In particular, the sequence controller 18 thereby controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 which comprises a keyboard 15, a mouse 16 and a monitor 14.

Figure 2:
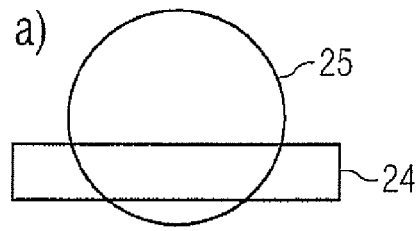
Figure 2:
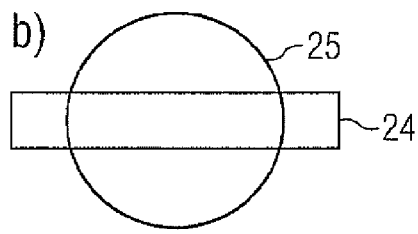
Figure 2:
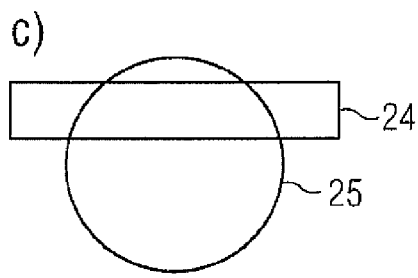

Movement of an organ (for example the liver) 25 to be examined relative to a slice 24 that is stationary relative to the magnetic resonance system 5 (and therefore relative to the magnetic resonance system 5) is schematically depicted in FIGS. 2a through 2c. Under the assumption that FIGS. 2a through 2c were created in chronological order, it is apparent that the slice 24 is located in the lower region of the liver 25 in FIG. 2a while—due to the liver 25 moving downward in FIGS. 2a through 2c—said slice 24 is located in the middle of the liver 25 in FIG. 2b and in the upper region of the liver 25 in FIG. 2c.

If FIG. 2a marks the upper reversal point of the liver 25 and FIG. 2c marks the lower reversal point of the liver 25 relative to the slice 24, the order FIG. 2a, FIG. 2b, FIG. 2c, FIG. 2b, FIG. 2a then represents a movement period of the liver 24 relative to the slice 25, wherein the liver 24 starts at its upper reversal point and returns via its lower reversal point to its upper reversal point.

It is noted that FIGS. 2a through 2c are not drawn true to scale. Normally the relative motion of the slice 24 spans only a small portion (for example 20 to 30%) of the liver 25 and not nearly the entire liver, as is shown in simplified form in FIGS. 2a through 2c.

In the following the present invention is explained using a determination of an exact temperature curve at a designated point of the moving organ (the liver), with reference to FIG. 3.

First a slice 24 is determined which intersects the liver. This slice 24 is determined such that—in spite of the relative motion between the slice 24 and the liver 25—an intersection always exists between the liver 25 and this slice 24, for example as is the case in FIGS. 2a through 2c. For example, the slice 24 can be arranged relative to the liver 25 such that the direction of the relative motion of the liver 25 (for example due to breathing/cardiac cycles of the patient O) takes place parallel to a normal vector which is situated perpendicular to the slice plane, as this is the case in FIGS. 2a through 2c. Expressed in a different way, the slice 24 moves within the liver 25 via the relative motion.

Temperature maps of the slice are subsequently created, for example by determining the proton resonance frequency shift of the water protons at multiple points in time. Modern methods enable a temperature map to be created for the slice within 100-250 ms. In FIG. 3 the temperature is now plotted over time for a specific point (for a voxel or a point) of the slice 24 with the periodically running curve 31. Although the temperature is always determined at the same point of the slice 24, the shown periodic curve or the periodic oscillation result due to the periodic relative motion the liver 25 relative to the slice 24 that is stationary in space. Using the frequency of the curve 31 which corresponds to the breathing frequency of the patient O, a period duration of approximately 6 s results. Within this period duration the sought point of the slice 24 moves within the liver 25 along a temperature gradient which, for example, results in that the liver 25 is heated to 60° C. in certain portions during a tumor therapy method. Expressed differently, the temperature curve of the corresponding point of the slice is modulated by the continuous, periodic motion of the liver 25 (which moves by up to 2 cm due to the breathing motion).

Since the liver 25 moves periodically, the corresponding point of the slice 24 always moves along the same line segment within the liver 25. Expressed in a different way, the corresponding location always sweeps the same points of the same line segment within the liver 25. Since these points of the line segment have different temperatures due to the temperature gradient, the temperature at a specific point within the liver 25 can be extrapolated from the measured temperature curve 31. In the case of tumor ablation, the temperature difference between two points which are situated 1-2 cm apart amounts to 10-30° C., for example. For the temperature curve 31 shown in FIG. 3, the temperature difference between the point at the start of the line segment and the point at the end of the line segment amounts to approximately 8° C., as results from the amplitude of the temperature curve 31.

Since the corresponding point of the slice 24 always spans the same points of the line segment, and since it is known that the temperature increases (or decreases, depending on the viewing direction) monotonically along the line segment, the location within the liver 25 can be concluded from the point which a measurement value assumes within the temperature curve 31. For example, the corresponding point of the slice 24 is always located at the same location (at the same point of the line segment) when the temperature value or, respectively, measurement value for the corresponding point corresponds to the maximum or the minimum of the temperature curve 31. The corresponding point is similarly located at a different same location within the liver 25 when the measurement value corresponds to the average value of a period as is shown with the course 32 of the curve in FIG. 3.

Expressed differently, the temperature curve 32 reflects the curve of the temperature at a defined, unchanging point of the liver 25.

Since, in the example shown in FIG. 3, the temperature for a specific liver slice is measured only at an interval of approximately 3 s (twice per period), it can be advantageous to extrapolate temperatures for intermediate points in time.

In order to now show the curve of the temperature at a different point within the liver, a curve path can be constructed, for example, that intersects the periodic curve 31 at 10% below the maximum value of the amplitude (thus above the curve path 32 in FIG. 3). In other words, the temperature curve for each point of the line segment which is swept by the corresponding location of the slice can be reconstructed from the curve 31 and presented.

It is noted that, instead of an evaluation of the phase of the MR signal (as in the PRF method), there is also the possibility to evaluate other temperature dependencies. In other words, in addition to the PRF method there are additional MR methods for temperature determination which are based on other physical effects (than the PRF method). For example, the T1 times and diffusion coefficients are also dependent on the temperature of the corresponding tissue. Therefore, within the scope of the present invention the change of the T1 times—and therefore the change of the temperature, and therefore also the temperature itself—can be determined with spatial resolution, for example by means of T1-weighted magnitude images. Expressed in a different way, in this case the functional maps (temperature maps) are obtained from magnitude images.

Multiple temperature curves 33-37 are shown in FIG. 4 for different points of the line segment which are swept by the corresponding location of the slice 24 for which the periodic temperature curve 31 was determined.

The considerations explained with FIGS. 3 and 4 apply to all locations or voxels of the slice 24. Since, via the relative motion of the liver 25 relative to the slice 24, the slice 24 sweeps all liver slices which lie within a volume segment of the liver 25 with a thickness of 2 cm (thickness direction perpendicular to the slice plane), the temperature (and therefore the temperature curve) can be determined for each point of these liver slices.

In order to now determine the temperature within the entire liver 25, the temperature can be measured for multiple slices. If the spacing between these multiple slices is respectively not greater than the extent of the relative motion of the liver (thus not greater than 2 cm in the example), the entire volume of the liver 25 can be scanned with these slices insofar as the uppermost slice is located at the upper edge of the liver and the lowermost slice is located at the lower edge of the liver. A three-dimensional temperature set of the liver 25 can thereby be created.

While a temperature map for a slice is determined for a specific point in time, via evaluation of the magnitudes of the MR signals an anatomical MR image of this slice can also be created at this point in time. If a three-dimensional temperature set of the liver 25 is accordingly created by the use of multiple slices, an item of three-dimensional MR information of the liver can thus also be simultaneously reconstructed.

A flowchart of an embodiment of the method according to the invention is shown in FIG. 5.

In a first Step S1 a slice in the region or organ to be examined is determined. This slice is thereby determined such that an intersection between the slice and the organ always exists, even through the movement of the organ relative to the slice; the slice thus never lies outside of the organ.

In the following Step S2 a temperature map of the slice is subsequently, respectively created at multiple points in time.

A time-temperature curve is respectively created in Step S3 for selected points of the slice. These points are optimally determined such that, due to the movement of the organ, they move relative to the slice in a segment of the organ which exhibits optimally large temperature differences.

In Step S4 the position of the slice relative to the organ is determined for specific points in time from the time-temperature curve of the selected points.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to determine a position of a slice of an examination subject relative to a region of the examination subject, the region moving relative to the slice, within a predetermined volume of the examination subject, comprising:
   operating a magnetic resonance data acquisition unit, in which the examination subject is located, to acquire spatially resolved data representing a physical property within the slice at multiple points in time, to produce a time curve of said physical property for at least one voxel of the slice, said physical property being selected from the group consisting of temperature, flow speed of a fluid in the examination subject, a diffusion coefficient of diffusion of a substance in the examination subject, and a result of a spectral analysis; and
   in a processor, using said time curve to automatically determine the position of the slice relative to the region at defined points in time.

2. A method as claimed in claim 1 wherein said region moves periodically relative to said slice, and comprising producing said time curve of said physical property as a periodic time curve, and, in said processor, determining said position of said slice relative to said region dependent on a position of the physical property within a period of said time curve.

3. A method as claimed in claim 1 comprising, from said spatially resolved data, detecting an absolute value of said physical property for each voxel of said slice at said multiple points in time and, in said processor, determining the position of the slice relative to the region by determining said absolute value of said physical property periodically with said relative motion of said region for a same respective voxel of said region.

4. A method as claimed in claim 1 comprising, from said spatially resolved data, detecting an absolute value of said physical property for each voxel at said multiple points in time, and detecting the absolute value of the physical property respectively for voxels of multiple slices in said region, and determining the respective position of each slice relative to said region by periodically reconstructing the absolute value of the physical property with the relative motion of the region for respective voxels of said multiple slices.

5. A method as claimed in claim 1 comprising detecting said spatially resolved data from a magnitude of a magnetic resonance signal from said region of the examination subject for each voxel of said slice at said multiple points in time, and respectively detecting said magnitude for voxels of each of multiple slices in said region, and determining respective positions of each slice relative to said region and implementing an imagery construction algorithm to reconstruct an anatomical magnetic resonance image of the region using the detected magnitudes.

6. A method as claimed in claim 5 comprising also determining the respective positions of each slice dependent on the detected magnitudes.

7. A method as claimed in claim 1 wherein an extent of the relative motion is predetermined, and acquiring said spatially-resolved data from multiple slices within said volume dependent on said extent to cause said multiple slices to encompass an entirety of said region due to said relative motion, and detecting said physical property within the multiple slices at said multiple points in time, with an absolute value of the physical property for each voxel of each of the slices being detected at said multiple points in time, and detecting the absolute value of the physical property for voxels of each of said multiple slices and determining the position of each of the slices relative to the region dependent on the time curve, with the absolute value of the physical property being reconstructed for each voxel of each of said slices.

8. A method as claimed in claim 1 wherein said physical property is temperature, and using the determination of the position of the slice relative to the region in a computerized monitoring system for monitoring or controlling a tumor therapy administered to the examination subject.

9. A magnetic resonance system to determine a position of a slice of an examination subject relative to a region of the examination subject, the region moving relative to the slice, within a predetermined volume of the examination subject, comprising:

a magnetic resonance data acquisition unit;

a control unit configured to operate said magnetic resonance data acquisition unit, in which the examination subject is located, to acquire spatially resolved data representing a physical property within the slice at multiple points in time, to produce a time curve of said physical property for at least one voxel of the slice, said physical property being selected from the group consisting of temperature, flow speed of a fluid in the examination subject, a diffusion coefficient of diffusion of a substance in the examination subject, and a result of a spectral analysis; and a processor configured to use said time curve to automatically determine the position of the slice relative to the region at defined points in time.

10. A non-transitory, computer-readable data storage medium encoded with programming instructions, said storage medium being loaded into a computerized control and evaluation system of a magnetic resonance system, said magnetic resonance system also comprising a magnetic resonance data acquisition unit, and said programming instructions causing said computerized control and evaluation system to:

operate a magnetic resonance data acquisition unit, in which the examination subject is located, to acquire spatially resolved data representing a physical property within the slice at multiple points in time, to produce a time curve of said physical property for at least one voxel of the slice, said physical property being selected from the group consisting of temperature, flow speed of a fluid in the examination subject, a diffusion coefficient of diffusion of a substance in the examination subject, and a result of a spectral analysis; and use said time curve to automatically determine the position of the slice relative to the region at defined points in time.

* * * * *